(12) United States Patent
Lu et al.

(10) Patent No.: US 11,728,278 B2
(45) Date of Patent: Aug. 15, 2023

(54) BOARD SUBSTRATES, THREE-DIMENSIONAL INTEGRATED CIRCUIT STRUCTURES AND METHODS OF FORMING THE SAME

(71) Applicant: Taiwan Semiconductor Manufacturing Co., Ltd., Hsinchu (TW)

(72) Inventors: Chung-Yu Lu, Hsinchu (TW); Ping-Kang Huang, Chiayi (TW); Sao-Ling Chiu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/561,045

(22) Filed: Sep. 5, 2019

(65) Prior Publication Data

US 2020/0312770 A1 Oct. 1, 2020

Related U.S. Application Data

(60) Provisional application No. 62/823,005, filed on Mar. 25, 2019.

(51) Int. Cl.
| | |
|---|---|
| H01L 23/538 | (2006.01) |
| H01L 23/498 | (2006.01) |
| H01L 25/10 | (2006.01) |
| H01L 21/48 | (2006.01) |
| H01L 21/56 | (2006.01) |
| H01L 23/00 | (2006.01) |

(52) U.S. Cl.
CPC ...... *H01L 23/5386* (2013.01); *H01L 21/4853* (2013.01); *H01L 21/4857* (2013.01); *H01L 21/56* (2013.01); *H01L 23/49816* (2013.01); *H01L 23/5385* (2013.01); *H01L 25/105* (2013.01); *H01L 23/5384* (2013.01); *H01L 24/16* (2013.01); *H01L 2224/16235* (2013.01)

(58) Field of Classification Search
CPC ............ H01L 23/5386; H01L 21/4853; H01L 21/4857; H01L 21/56; H01L 23/49816; H01L 23/5385; H01L 25/105
USPC ........................................................ 257/668
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |

(Continued)

*Primary Examiner* — Xia L Cross
(74) *Attorney, Agent, or Firm* — JCIPRNET

(57) ABSTRACT

Board substrates, three-dimensional integrated circuit structures and methods of forming the same are disclosed. A board substrate includes a core layer, a first build-up layer, a second build-up layer, a first group of bumps, a second first group of bumps and at least one first underfill blocking wall. The first build-up layer and the second build-up layer are disposed on opposite sides of the core layer. The first group of bumps is disposed over the first build-up layer. The second first group of bumps is disposed over the first build-up layer. The at least one first underfill blocking wall is disposed over the first build-up layer and between the first group of bumps and the second group of bumps.

20 Claims, 9 Drawing Sheets

(56) References Cited

U.S. PATENT DOCUMENTS

| | | | |
|---|---|---|---|
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 9,978,731 B1* | 5/2018 | Kim | H01L 23/66 |
| 2008/0061437 A1* | 3/2008 | Kohara | H01L 23/13 |
| | | | 257/E23.068 |
| 2009/0223046 A1* | 9/2009 | Murayama | H01L 24/81 |
| | | | 29/847 |
| 2012/0018871 A1* | 1/2012 | Lee | H01L 23/4334 |
| | | | 257/698 |
| 2012/0193779 A1* | 8/2012 | Lee | H01L 24/97 |
| | | | 257/737 |
| 2013/0093097 A1* | 4/2013 | Yu | H01L 21/4853 |
| | | | 257/777 |
| 2014/0124957 A1* | 5/2014 | Iwase | H01L 25/0652 |
| | | | 257/777 |
| 2015/0155218 A1* | 6/2015 | Hung | H01L 23/3677 |
| | | | 257/713 |
| 2017/0110413 A1* | 4/2017 | Chen | H01L 24/20 |
| 2019/0043771 A1* | 2/2019 | Chang | H01L 23/49816 |
| 2020/0144224 A1* | 5/2020 | Lin | H01L 24/13 |
| 2020/0211946 A1* | 7/2020 | Miki | H01L 23/49822 |
| 2020/0251353 A1* | 8/2020 | Lu | H01L 21/565 |
| 2020/0266167 A1* | 8/2020 | Lee | H01L 24/48 |

* cited by examiner

BOARD SUBSTRATES, THREE-DIMENSIONAL INTEGRATED CIRCUIT STRUCTURES AND METHODS OF FORMING THE SAME

CROSS-REFERENCE TO RELATED APPLICATION

This application claims the priority benefit of U.S. provisional application Ser. No. 62/823,005, filed on Mar. 25, 2019. The entirety of the above-mentioned patent application is hereby incorporated by reference herein and made a part of this specification.

BACKGROUND

These smaller electronic components also require smaller packages that occupy less area than previous packages. Examples of types of semiconductor packages include quad flat packages (QFP), pin grid array (PGA) packages, ball grid array (BGA) packages, flip chips (FC), three-dimensional integrated circuits (3DICs), wafer level packages (WLPs), and package on package (PoP) devices, etc.

In terms of the packaging used for electronic devices or semiconductor chips, one or more chip packages are generally bonded to a printed circuit board for electrical connections to other external devices or electronic components. Although the existing printed circuit boards and three-dimensional integrated circuits have been generally adequate for their intended purposes, they have not been entirely satisfactory in all respects.

DETAILED DESCRIPTION

Figure 1A:
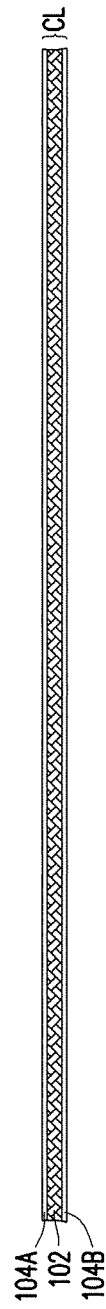
FIG. 1A to FIG. 1G are cross-sectional views of a method of forming a three-dimensional integrated circuit (3DIC) structure in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are cross-sectional views of a method of forming a three-dimensional integrated circuit (3DIC) structure in accordance with some embodiments.

Referring to FIG. 1A, a core layer CL is provided. In some embodiments, the core layer CL includes a core dielectric layer 102, a first core conductive layer 104A and a second core conductive layer 104B. In some embodiments, the core dielectric layer 102 includes prepreg (which contains epoxy, resin, and/or glass fiber), polyimide, photo image dielectric (PID), a combination thereof, or the like. However, the disclosure is not limited thereto, and other dielectric materials may also be used. The first core conductive layer 104A and the second core conductive layer 104B are formed on the opposite sides of the core dielectric layer 102. In some embodiments, the first core conductive layer 104A and the second core conductive layer 104B include copper, gold, tungsten, aluminum, silver, gold, a combination thereof, or the like. In some embodiments, the first core conductive layer 104A and the second core conductive layer 104B are copper foils coated or plated on the opposite sides of the core dielectric layer 102.

Figure 1B:
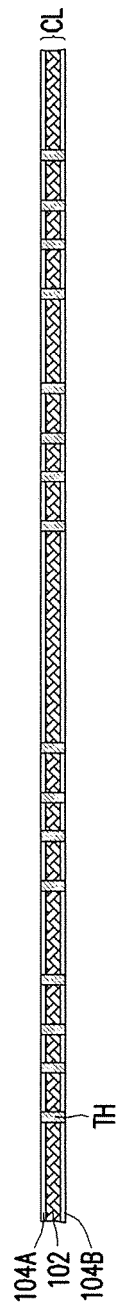

Referring to FIG. 1B, a plurality of plated through holes TH is formed to penetrate through the core layer CL. In some embodiments, the plated through holes TH provide electrical paths between the electrical circuits located on the opposite sides of the core layer CL. In some embodiments, the plated through holes TH may be filled with one or more conductive materials. In some embodiments, the plated through holes TH may be lined with a conductive material and filled up with an insulating material. In some embodiments, the method of forming the plated through holes TH includes the following operations. First, through holes (not shown) are formed at the predetermined positions by, for example, a mechanical or laser drilling, an etching, or another suitable removal technique. A desmear treatment may be performed to remove residues remaining in the through holes. Subsequently, the through holes may be plated with one or more conductive materials to a predetermined thickness, thereby providing the plated through holes TH. For example, the through holes may be plated with copper with an electroplating or an electroless plating.

Figure 1C:
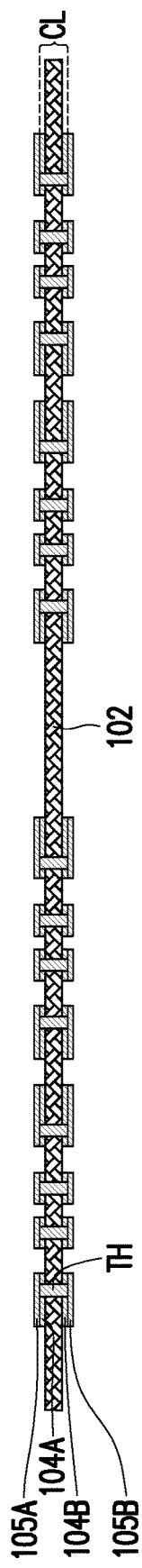

Referring to FIG. 1C, conductive materials (not shown) are formed over the first and second core conductive layers 104A and 104B, and formed over the plated through holes TH. For example, copper is plated on the surfaces of the first and second core conductive layers 104A and 104B and the surfaces of the plated through holes T with an electroplating or an electroless plating. Thereafter, the conductive materials and the first and second core conductive layers 104A and 104B may be patterned together to form first and second conductive lids 105A and 105B that are located respectively over the remaining first and second core conductive layers 104A and 104B. In some embodiments, portions of the conductive materials and portions of the first and second core conductive layers 104A and 104B may be removed using a photolithography and etching process or another suitable removal technique.

Figure 1D:
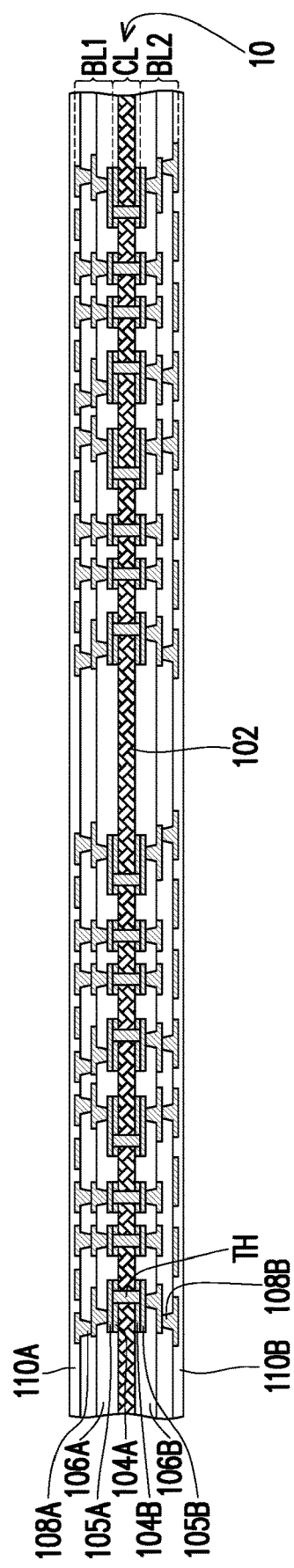

Referring to FIG. 1D, a first build-up layer BL1 and a second build-up layer BL2 are formed on the opposite sides of the core layer CL. Specifically, the first build-up layer BL1 is formed over the first core conductive layer 104A of the core layer CL, and the second build-up layer BL2 is formed over the second core conductive layer 104B of the first core layer CL. In some embodiment, the formation of the first build-up layer BL1 may include sequentially forming a plurality of first dielectric layers 106A and a plurality of first conductive patterns 108A alternately stacked over the first surface of the core layer CL. Similarly, the formation of the second build-up layer BL2 may include sequentially forming a plurality of second dielectric layers 106B and a plurality of second conductive patterns 108B alternately stacked over the second surface of the core layer CL. Although only two layers of conductive patterns and two layers of dielectric layers are illustrated for each of the first build-up layer BL1 and the second build-up layer BL2, the scope of the disclosure is not limited thereto. In other embodiments, the number of dielectric layers (106A/106B) and the number of the conductive patterns (108A/108B) may be adjusted upon the design requirements. In some embodiments, the total number of layers of the first build-up layer BL1 and the second build-up layer BL2 may sum up to a total of 28 to 36 layers for the conductive patterns and dielectric layers. In some embodiments, the number of layers in the first build-up layer BL1 is equal to the number of layers in the second build-up layer BL2.

In some embodiments, the first build-up layer BL1 and the second build-up layer BL2 are electrically connected to the plated through holes TH. For example, the first and second conductive patterns 108A and 108B may be electrically connected to the plated through holes TH through the first and second conductive lids 105A and 105B and the first and second core conductive layers 104A and 104B.

In some embodiments, the first and second dielectric layers 106A and 106B include a polymer material or an insulating material. In some embodiments, the first and second dielectric layers 106A and 106B include prepreg (which contains epoxy, resin, and/or glass fiber), polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof, or the like. In some embodiments, the first and second dielectric layers 106A and 106B may be patterned using a photolithography and/or etching process. In some embodiments, the first and second dielectric layers 106A and 106B may be patterned by a film lamination followed by a laser drilling process.

In some embodiments, the first and second conductive patterns 108A and 108B include metal, such as aluminum, titanium, copper, nickel, tungsten, and/or alloys thereof. In some embodiments, the first and second conductive patterns 108A and 108B may be formed by a deposition followed by a photolithography and etching process. In some embodiments, the first and second conductive patterns 108A and 108B may be formed by an electroplating or an electroless plating.

Still referring to FIG. 1D, a first mask layer 110A is formed over the outermost first dielectric layer 106A and covers the outermost first conductive pattern 108A of the first build-up layer BL1, and a second mask layer 110B is formed over the outermost second dielectric layer 106B and covers the outermost second conductive pattern 108B of the second build-up layer BL2. In some embodiments, each of the first and second mask layers 110A and 110B includes a solder mask material, a photoresist, a dielectric material or a passivation material. In some embodiments, the first and second mask layers 110A and 110B may be formed of materials having a chemical composition of silica, barium sulfate and epoxy resin, and/or the like. For example, the first and second mask layers 110A and 110B may serve as solder masks and may be selected to prevent short, corrosion or contamination of the circuit pattern and protect the circuit of the printed circuit board from external impacts and chemicals. At this stage, a board substrate 10 includes a core layer CL, a first build-up layer BL1, a second build-up layer BL2, a first mask layer 110A and a second mask layer 110B is thus completed.

Figure 1E:
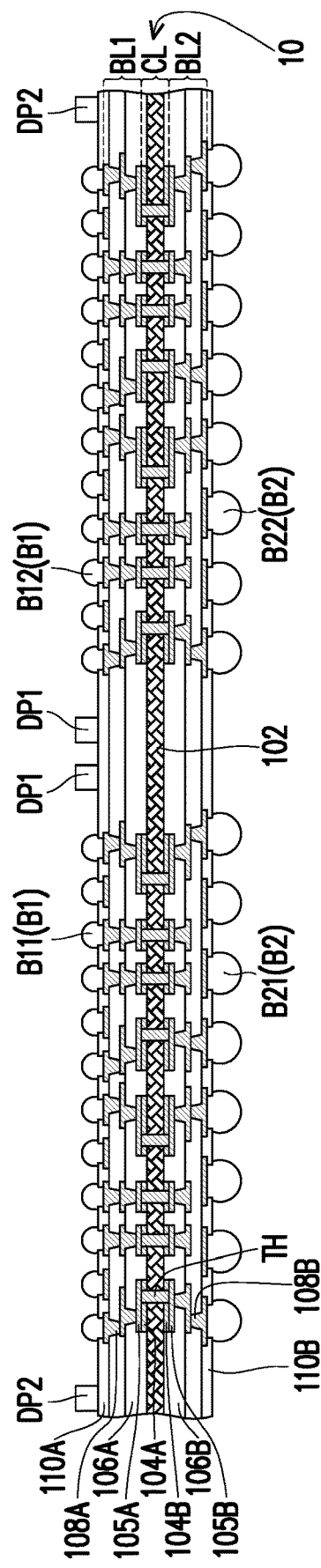

Referring to FIG. 1E, at least one first dummy pattern DP1 is formed over the board substrate 10. In some embodiments, the at least one first dummy pattern DP1 is formed on the first mask layer 110A on a center region of the board substrate 10. In some embodiments, at least one second dummy pattern DP2 is formed during the step of forming the at least one first dummy pattern DP1, and the at least one second dummy pattern DP2 is on an edge region of the board substrate 10. Specifically, as shown in FIG. 1E, two separate first dummy patterns DP1 are formed on the center region of the board substrate 10, and two separate second dummy patterns DP2 are formed on the edge region of the board substrate 10 and disposed respectively at two sides of the first dummy patterns DP1.

The first and second dummy patterns DP1 and DP2 are configured to prevent an underfill material from bleeding to undesired bumps or chips during the subsequent underfill dispensing step, which will be described in details below.

In some embodiments, each of the first and second dummy patterns DP1 and DP2 includes an insulating layer or a polymer material, and the forming method thereof includes performing a dispensing process, an injecting process, or a spraying process. In some embodiments, each of the first and second dummy patterns DP1 and DP2 includes a material the same as that of a dielectric layer of the board substrate 10. For example, each of the first and second dummy patterns DP1 and DP2 includes prepreg (which contains epoxy, resin, and/or glass fiber), polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof, or the like. In some embodiments, the first and second dummy patterns DP1 and DP2 include the same material and are formed in the same process step. However, the disclosure is not limited thereto. In alternative embodiments, the first and second dummy patterns DP1 and DP2 can include different materials and may be formed in different process steps.

Still referring to FIG. 1E, the first mask layer 110A is patterned to have a plurality of first openings that partially exposes the outermost first conductive pattern 108A, and the second mask layer 110B is patterned to have a plurality of second openings that partially exposes the outermost second conductive pattern 108B.

Thereafter, a plurality of first bumps B1 is formed in the first openings of the first mask layer 110A over the first build-up layer BL1, and a plurality of second bumps B2 is formed in the second openings of the second mask layer 110B over the second build-up layer BL2. In some embodiments, the first bumps B1 can be divided into a first group of bumps B11 and a second group of bumps B12 at two sides of the first dummy patterns DP1. Similarly, the second bumps B2 can be divided into a third group of bumps B21 and a fourth group of bumps B22 at two sides of the first dummy patterns DP1. In some embodiments, the first group of bumps B11 and the third group of bumps B21 are at one side of the first dummy patterns DP1, and the second group of bumps B21 and the fourth group of bumps B22 are at another side of the first dummy patterns DP1.

In some embodiments, the first bumps B1 and the second bumps B2 may be solder bumps, and/or may include metal pillars (e.g., copper pillars), solder caps formed on metal pillars, and/or the like. When solder is used, the solder may include either eutectic solder or non-eutectic solder. The solder may include lead or be lead-free, and may include Sn—Ag, Sn—Cu, Sn—Ag—Cu, or the like. The first bumps B1 and the second bumps B2 may be formed respectively by a suitable process such as an evaporation, an electroplating, a ball drop, or a screen printing. In some embodiments, the size of the first bumps B1 is different from (e.g., less than) the size of the second bumps B2. In some embodiments, the number of the first bumps B1 is different from (e.g., greater than) the number of the second bumps B2. However, the disclosure is not limited thereto. The size and/or the number of the first bumps B1 may be similar to the size and/or the number of the second bumps B2.

At this point, the board substrate 10 according to some embodiments of the disclosure is thus completed. In some embodiments, the board substrate 10 includes a core layer CL, a first build-up layer BL1, a second build-up layer BL2, first bumps B1, second bumps B2, at least one first dummy pattern DP1 and at least one second dummy pattern DP2. The board substrate may be called a circuit board structure, a circuit carrier, a system board or a circuit substrate in some examples. The board substrate of the disclosure and its modifications will be described in details below.

Figure 1F:
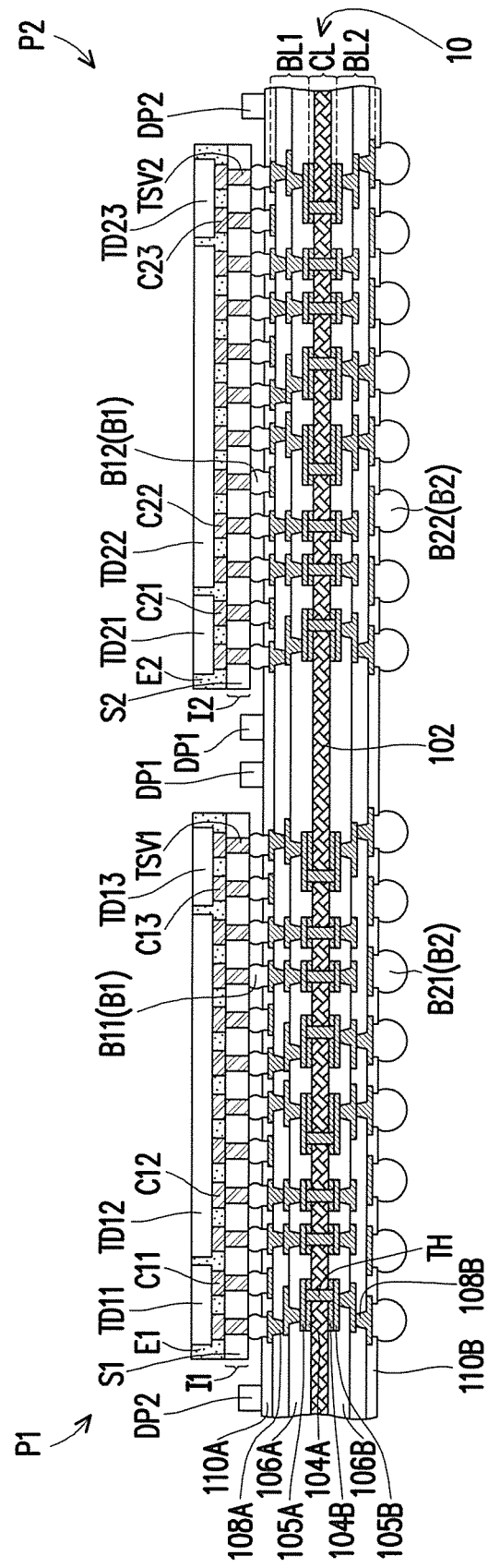

Referring to FIG. 1F, a first semiconductor package P1 and a second semiconductor structure P2 are bonded to the board substrate 10 at two sides of the at least one first dummy pattern DP1.

In some embodiments, the first semiconductor package P1 may be disposed over and electrically connected to the board substrate 10 through the first group of bumps B11. In some embodiments, the first semiconductor package P1 includes a first interposer I1 disposed over and electrically connected to the board substrate 10.

Various embodiments include one or more die stacks or semiconductor chips bonded to an interposer. The interposer provides electrical routing between the chips. In some embodiments, the first interposer I1 includes a first semiconductor substrate S1 and a plurality of first through substrate vias TSV1 through the first semiconductor substrate S1. In some embodiments, the first semiconductor substrate S1 includes silicon, and the first through substrate vias TSV1 include through silicon vias. In some embodiments, the first interposer I1 may include a redistribution layer structure disposed on the first semiconductor substrate S1 and bumps disposed on the redistribution layer structure to provide electrical connectors for bonding to various components.

In some embodiments, the first semiconductor package P1 further includes a plurality of first semiconductor chips TD11, TD12 and TD13 arranged side by side and disposed over and electrically connected to the first interposer I1. In some embodiments, the first semiconductor package P1 is a single and super large package including multiple first semiconductor chips. The first semiconductor chips may be arranged laterally and/or stacked vertically as needed. In alternative embodiments, the first semiconductor package P1 includes a plurality of individual packages, and each package includes at least one first semiconductor chip. The first semiconductor chips are called first top dies in some examples.

In some embodiments, the first semiconductor package P1 may include application processors (AP), System-On-Chips (SoC), Chip-On-Wafer (CoW) packages, Integrated-Fan-Out (InFO) packages, Chip-On-Wafer-On-Substrate (CoWoS) packages, other three-dimensional integrated circuit (3DIC) packages, or a combination thereof. In some embodiments, the first semiconductor chips TD11, TD12 and TD13 may include integrated active devices, integrated passive device or both. For example, the first semiconductor package P1 may include a wide variety of devices, such as processors, resistors, capacitors, transistors, diodes, fuse devices, logic devices, memory devices, discrete electronic devices, power devices, thermal dissipation devices, and/or the like. In some embodiments, at least one of the first semiconductor chips TD11, TD12 and TD13 may be a dummy chip. Herein, a dummy die indicates a non-operating die, a die configured for non-use, a die without devices therein or a die used only to electrically couple together two other dies in the die stack. The first semiconductor chips TD11, TD12 and TD13 may have the same or different sizes and/or functions upon the design requirements. In some embodiments, the first semiconductor chip TD12 is greater than the first semiconductor chip TD11 or TD13.

In some embodiments, the first semiconductor chips TD11, TD12 and TD13 respectively have first connectors C11, C12 and C13 formed as the top portions of the first semiconductor chips TD11, TD12 and TD13. The first connectors C11, C12 and C13 protrude from the remaining portions or lower portions of the first semiconductor chips TD11, TD12 and TD13. In some embodiments, the sides of the first semiconductor chips TD11, TD12 and TD13 with the first connectors C11, C12 and C13 are referred to as front sides. The first connectors C11, C12 and C13 may include Cu, W, Ni, Sn, Ti, Au, an alloy or a combination thereof, and may be formed with a ball drop process or an electroplating process. In some embodiments, the first connectors C11, C12 and C13 are referred to as front-side connectors of the first semiconductor chips TD11, TD12 and TD13, respectively.

In some embodiments, the first semiconductor package P1 further includes a first encapsulation layer E1 between the first semiconductor chips TD11, TD12 and TD13. In some embodiments, the first encapsulation layer E1 is formed to encapsulate or surround the sidewalls of the first semiconductor chips TD11, TD12 and TD13. In some embodiments, the first encapsulation layer E1 includes a molding compound, a molding underfill, a resin or the like, such as epoxy. In some embodiments, the first encapsulation layer E1 includes a polymer material such as polybenzoxazole (PBO), polyimide, benzocyclobutene (BCB), a combination thereof, or the like, and is formed by a molding process followed by a grinding process until surfaces of the first connectors C11, C12 and C13 of the first semiconductor chips TD11, TD12 and TD13 are exposed.

The second semiconductor package P2 may have a structure similar to that of the first semiconductor package P1.

In some embodiments, the second semiconductor package P2 may be disposed over and electrically connected to the board substrate 10 through the second group of bumps B12. In some embodiments, the second semiconductor package P2 includes a second interposer I2 disposed over and electrically connected to the board substrate 10.

Various embodiments include one or more die stacks or semiconductor chips bonded to an interposer. The interposer provides electrical routing between the chips. In some embodiments, the second interposer I2 includes a second semiconductor substrate S2 and a plurality of second through substrate vias TSV2 through the second semiconductor substrate S2. In some embodiments, the second semiconductor substrate S2 includes silicon, and the second through substrate vias TSV2 include through silicon vias. In some embodiments, the second interposer I2 may include a redistribution layer structure disposed on the second semiconductor substrate S2 and bumps disposed on the redistribution layer structure to provide electrical connectors for bonding to various components.

In some embodiments, the second semiconductor package P2 further includes a plurality of second semiconductor chips TD21, TD22 and TD23 arranged side by side and disposed over and electrically connected to the second interposer I2. In some embodiments, the second semiconductor package P2 is a single and super large package including multiple second semiconductor chips. The second semiconductor chips may be arranged laterally and/or stacked vertically as needed. In alternative embodiments, the second semiconductor package P2 includes a plurality of individual packages, and each package includes at least one second semiconductor chip. The second semiconductor chips are called second top dies in some examples.

In some embodiments, the second semiconductor package P2 may include application processors (AP), System-On-Chips (SoC), Chip-On-Wafer (CoW) packages, Integrated-Fan-Out (InFO) packages, Chip-On-Wafer-On-Substrate (CoWoS) packages, other three-dimensional integrated circuit (3DIC) packages, or a combination thereof. In some embodiments, the second semiconductor chips TD21, TD22 and TD23 may include integrated active devices, integrated passive device or both. For example, the second semiconductor package P2 may include a wide variety of devices, such as processors, resistors, capacitors, transistors, diodes, fuse devices, logic devices, memory devices, discrete electronic devices, power devices, thermal dissipation devices, and/or the like. In some embodiments, at least one of the second semiconductor chips TD21, TD22 and TD23 may be a dummy chip. Herein, a dummy die indicates a non-operating die, a die configured for non-use, a die without devices therein or a die used only to electrically couple together two other dies in the die stack. The second semiconductor chips TD21, TD22 and TD23 may have the same or different sizes and/or functions upon the design requirements. In some embodiments, the second semiconductor chip TD22 is greater than the second semiconductor chip TD21 or TD23.

In some embodiments, the second semiconductor chips TD21, TD22 and TD23 respectively have second connectors C21, C22 and C23 formed as the top portions of the second semiconductor chips TD21, TD22 and TD23. The second connectors C21, C22 and C23 protrude from the remaining portions or lower portions of the second semiconductor chips TD21, TD22 and TD23. In some embodiments, the sides of the second semiconductor chips TD21, TD22 and TD23 with the second connectors C21, C22 and C23 are referred to as front sides. The second connectors C21, C22 and C23 may include Cu, W, Ni, Sn, Ti, Au, an alloy or a combination thereof, and may be formed with a ball drop process or an electroplating process. In some embodiments, the second connectors C21, C22 and C23 are referred to as front-side connectors of the second semiconductor chips TD21, TD22 and TD23, respectively.

In some embodiments, the second semiconductor package P2 further includes a second encapsulation layer E2 between the second semiconductor chips TD21, TD22 and TD23. In some embodiments, the second encapsulation layer E2 is formed to encapsulate or surround the sidewalls of the second semiconductor chips TD21, TD22 and TD23. In some embodiments, the second encapsulation layer E2 includes a molding compound, a molding underfill, a resin or the like, such as epoxy. In some embodiments, the second encapsulation layer E2 includes a polymer material such as polybenzoxazole (PBO), polyimide, benzocyclobutene (BCB), a combination thereof, or the like, and is formed by a molding process followed by a grinding process until surfaces of the second connectors C21, C22 and C23 of the second semiconductor chips TD21, TD22 and TD23 are exposed.

The second semiconductor package P2 may have a structure different from that of the first semiconductor package P1.

In some embodiments, the second semiconductor package P2 may have a dimension the same as that of the first semiconductor package P1. In alternative embodiments, the second semiconductor package P2 may have a dimension different from that of the first semiconductor package P1. For example, the dimension includes a width, a length, a height, a size or a combination thereof.

Figure 1G:
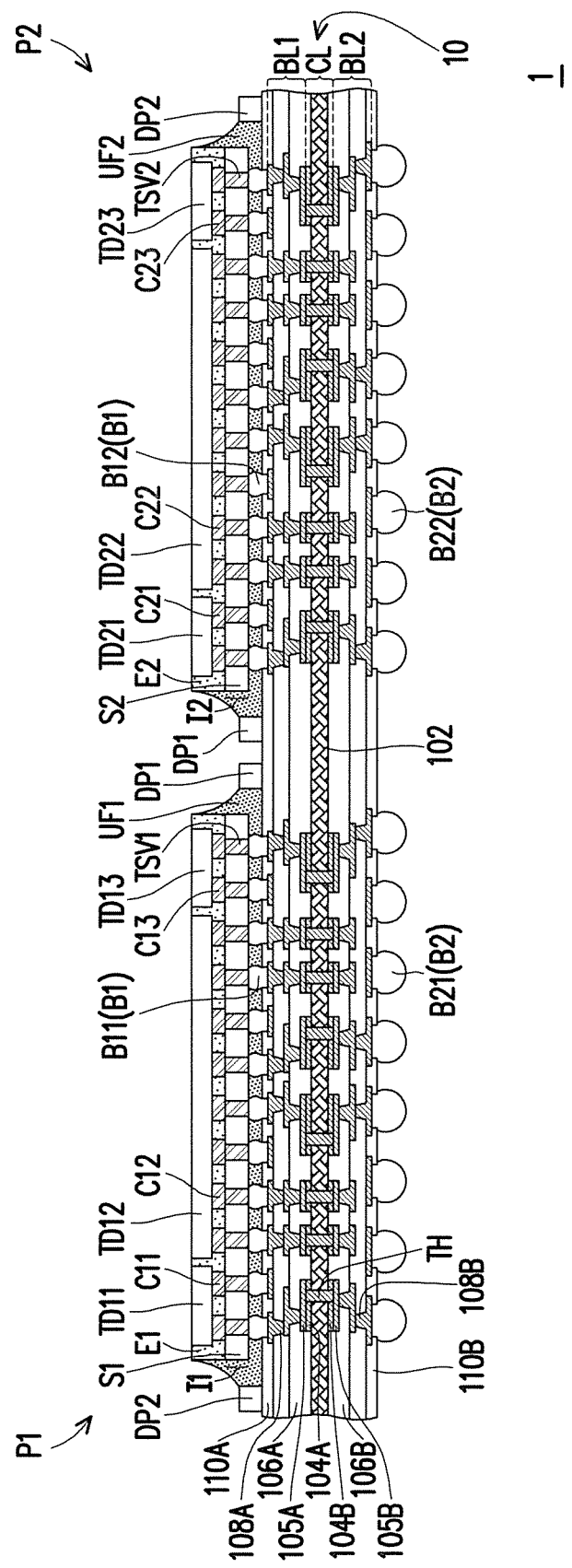

Referring to FIG. 1G, a first underfill layer UF1 is formed between the first semiconductor package P1 and the board substrate 10, and a second underfill layer UF2 is formed between the second semiconductor package P2 and the board substrate 10.

In some embodiments, a first underfill material is dispensed from a first dispenser, and then drawn by capillary action and therefore forms the first underfill layer UF1 that fills the space between the first interposer I1 and the board substrate 10 and surrounds the first group of bumps B11. Similarly, a second underfill material is dispensed from a second dispenser, and then drawn by capillary action and therefore forms the second underfill layer UF2 that fills the space between the second interposer I2 and the board substrate 10 and surrounds the second group of bumps B12. In some embodiments, a 3DIC structure 1 is thus completed.

It is noted that, the first dummy patterns DP1 constrain the flow of the first and second underfill materials, so that the first underfill material does not bleed to the second group of bumps B12 and the second underfill material does not bleed to the first group of bumps B11 during the underfill dispensing step. From another point of view, the first dummy patterns DP1 function as "armor blocks" that block the underfill material waves from reaching the undesired bumps, devices or packages. In some embodiments, the first dummy patterns DP1 can be referred to as "first underfill blocking walls" through the disclosure. In some embodiments, the first and second underfill layers UF1 and UF2 are in physical with the outer sidewalls of the first dummy patterns DP1, and the space between the inner sidewalls of the first dummy patterns DP1 is free of the underfill material. In some embodiments, the first and second underfill layers UF1 and UF2 may creep onto part of top surfaces of the first dummy patterns DP1.

Figure 3:
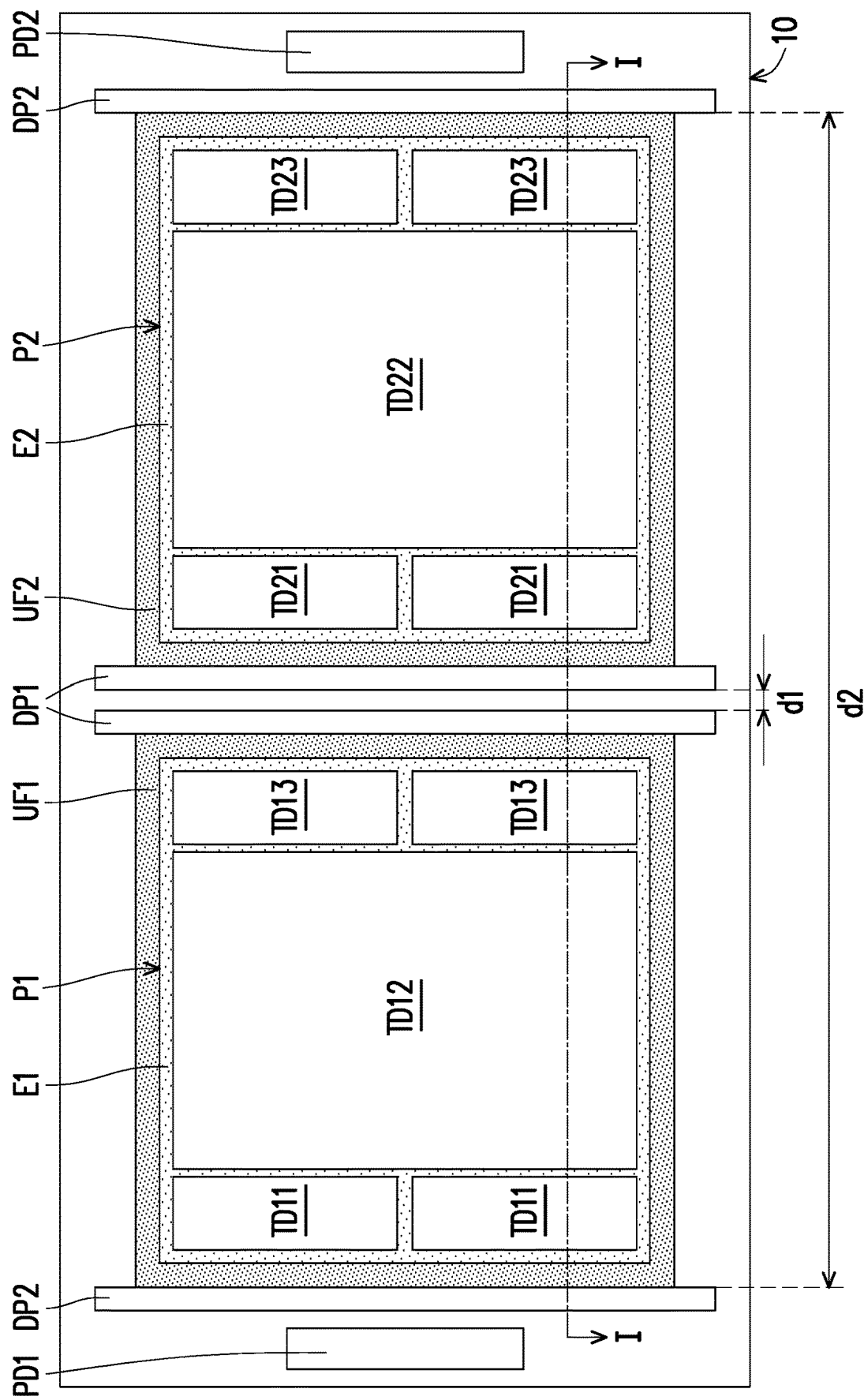
FIG. 3 to FIG. 5 are simplified top views of 3DIC structures in accordance with some embodiments.

In some embodiments, the second dummy patterns DP2 constrain the flow of the first and second underfill materials, so that the first underfill material does not bleed to the adjacent periphery device(s) PD1 (as shown in FIG. 3), and the second underfill material does not bleed to the adjacent periphery device(s) PD2 (as shown in FIG. 3) during the underfill dispensing step. From another point of view, the second dummy patterns DP2 function as "armor blocks" that block the underfill material wave from reaching the undesired bumps, devices or packages. In some embodiments, the second dummy patterns DP2 can be referred to as "second underfill blocking walls" through the disclosure. In some embodiments, the first and second underfill layers UF1 and UF2 may creep onto part of top surfaces of the second dummy patterns DP2.

In some embodiments, each of the first and second dummy patterns DP1 and DP2 has a dimension greater than that of the first group of bumps B11 or the second group of the bumps B12. For example, the dimension includes a height, a length, a width, a size or a combination thereof. In some embodiments, the height of the each of the first and second dummy patterns DP1 and DP2 is at least 1.2 times (e.g., 1.5 times or 2 times) the height of the first group of bumps B11 or the second group of the bumps B12.

In some embodiments, each of the first and second dummy patterns DP1 and DP2 has a dimension greater than that of the first semiconductor package P1 or the second semiconductor package P2. For example, the dimension includes a height, a length, a width. a size or a combination thereof. In some embodiments, the length of the each of the first and second dummy patterns DP1 and DP2 is at least 1.2 times (e.g., 1.5 times or 2 times) the length of the first semiconductor package P1 or the second semiconductor package P2.

Figure 2:
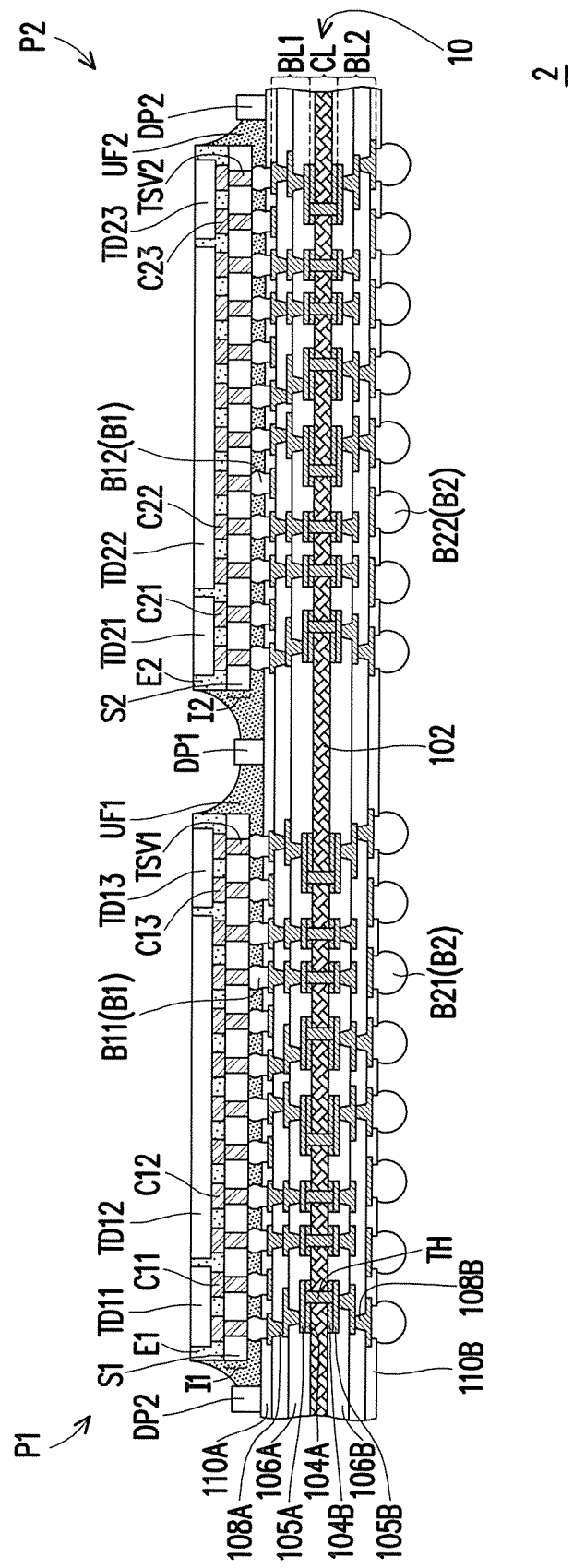
FIG. 2 is a cross-sectional view of a 3DIC structure in accordance with some embodiments.

The above embodiments in which two first dummy patterns DP1 are formed between first and second semiconductor packages P1 and P2 are provided for illustration purposes, and are not construed as limiting the present disclosure. In some embodiments, a single first dummy pattern DP1 is formed between first and second semiconductor packages P1 and P2, so as to further save the layout area, as shown in FIG. 2. In this embodiment, the first and second underfill layers UF1 and UF2 are in physical contact with the opposite sidewalls of the single first dummy pattern DP1, and the top surface of the single first dummy pattern DP1 is free of the underfill material. In some embodiments, a 3DIC structure 2 is thus completed.

Figure 4:
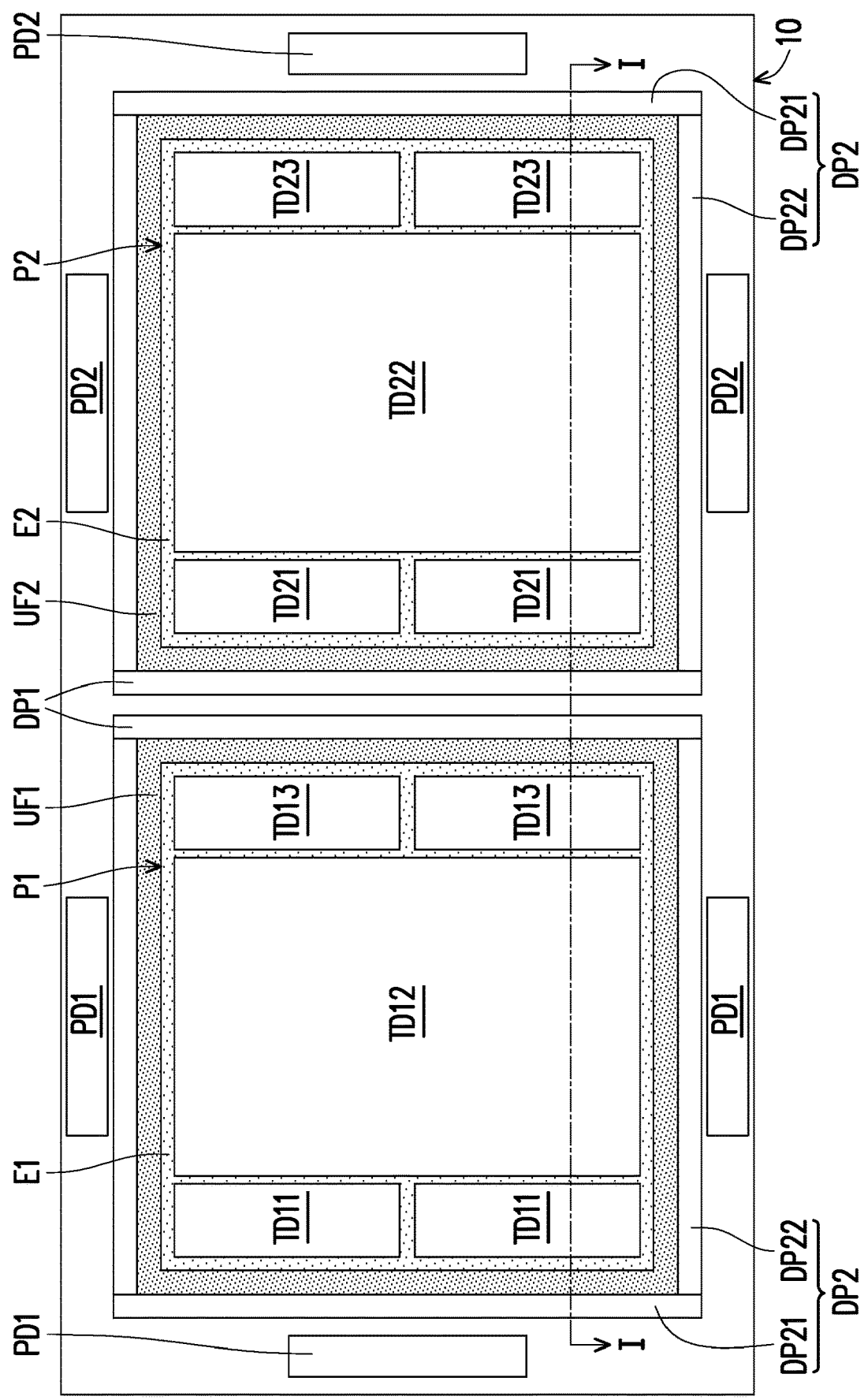
Figure 5:
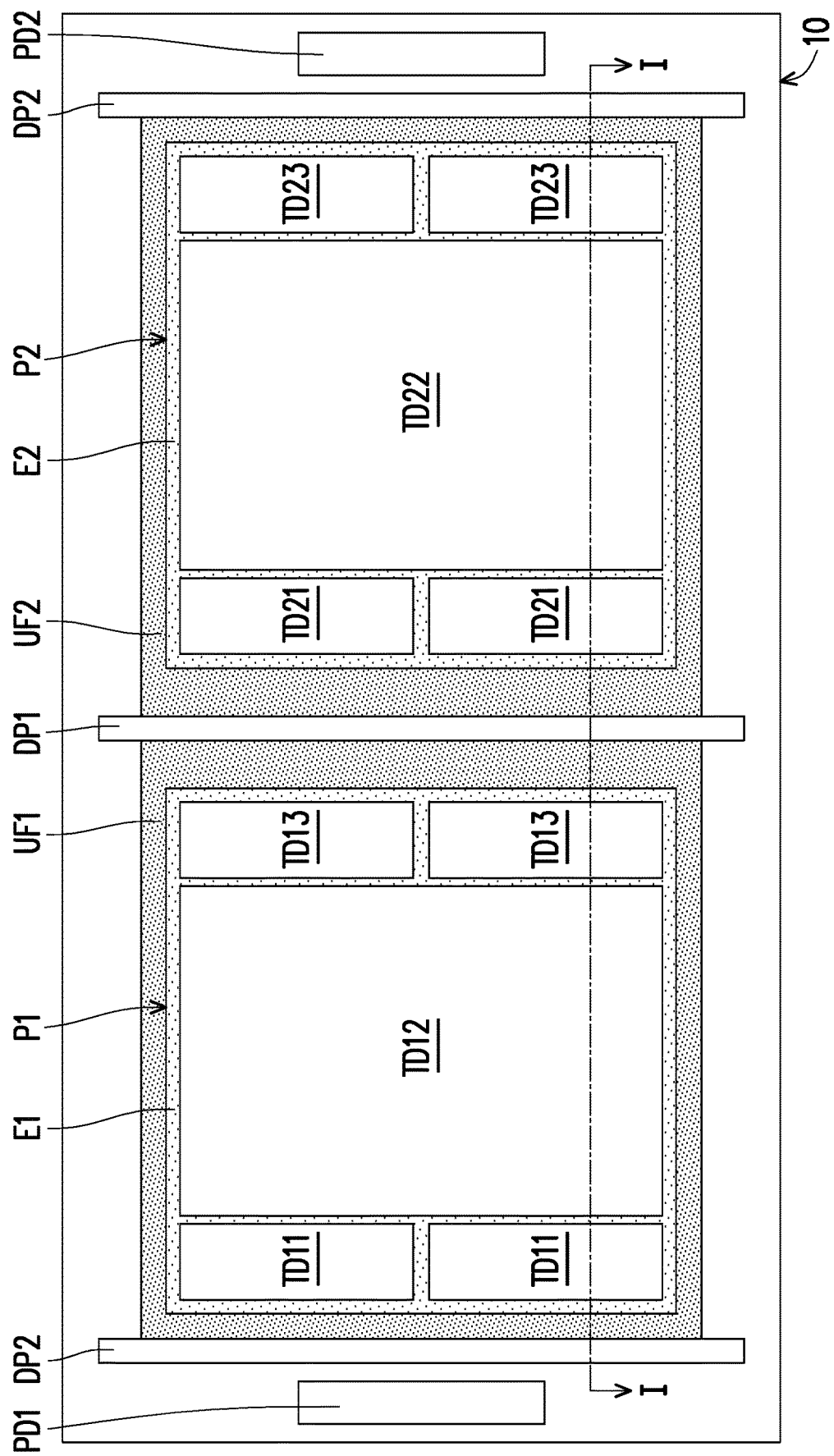

FIG. 3 to FIG. 5 are simplified top views of 3DIC structures in accordance with some embodiments. In some embodiments, FIG. 1G is the cross-sectional view taken along the line I-I of each of FIG. 3 and FIG. 4, and FIG. 2 is the cross-sectional view taken along the line I-I of FIG. 5.

The board substrates and 3DIC structures of the present disclosure are illustrated below with reference to the cross-sectional views of FIG. 1G and FIG. 2 and the top views of FIG. 3 to FIG. 5.

In some embodiments, the disclosure provides a board substrate 10 including a core layer CL, a first build-up layer BL1, a second build-up layer BL2, first bumps B1 and at least one first dummy pattern DP1. The first build-up layer BL1 and the second build-up layer BL2 are disposed on opposite sides of the core layer CL. The first bumps B1 are disposed over the first build-up layer BL1. In some embodiments, the first bumps B1 can be divided into a first group of bumps B11 and a second group of bumps B12 disposed at two sides of the first build-up layer BL1. The at least one first dummy pattern DP1 is disposed over the first build-up layer BL1 and between the first group of bumps B11 and the second group of bumps B12. The at least one first dummy pattern DP1 is called at least one first underfill blocking wall in some examples.

In some embodiments, the at least one first dummy pattern DP1 includes an insulating layer or a polymer material. In some embodiments, the at least one first dummy pattern DP1 includes a material the same as that of a dielectric layer of the first build-up layer BL1 of the board substrate 10. In some embodiments, the dimension of the at least one first dummy pattern DP1 is greater than a dimension of the first group of bumps B11 or the second group of bumps B12.

In some embodiments, the at least one first dummy pattern DP1 includes two strips substantially parallel to each other and separated by a distance d1, as shown in FIG. 3 to FIG. 4. In alternative embodiments, the at least one first dummy pattern DP1 includes a single strip, as shown in FIG. 5. In some embodiments, the at least one first dummy pattern DP1 is disposed on the central region of the board substrate 10.

In some embodiments, the board substrate 10 further includes at least one second dummy patterns DP2 disposed over the first build-up layer BL and located at an outer side of the first group of bumps B11 or the second group of bumps B12. The at least one second dummy pattern DP2 is called at least one second underfill blocking wall in some examples.

In some embodiments, the at least one second dummy pattern DP2 includes two strips substantially parallel to each other and separated by a distance d2, as shown in FIG. 3 to FIG. 5. The distance d2 is greater than the distance d1. In some embodiments, the second dummy patterns DP2 are substantially parallel to the first dummy patterns DP1, as shown in FIG. 3 and FIG. 5.

In some embodiments, some of the second dummy patterns DP2 are substantially parallel to the first dummy patterns DP1, while some of the second dummy patterns DP2 are perpendicular to the first dummy patterns DP1, as shown in FIG. 4. For example, the at least one second dummy pattern DP2 includes four separate strips extending in different directions. In some embodiments, some of the second dummy patterns DP2 (e.g., second dummy patterns DP21) extend in a direction substantially parallel to that of the first dummy patterns DP1, and some of the second dummy patterns DP2 (e.g., second dummy patterns DP22) extend in a direction different from that of the first dummy patterns DP1, as shown in FIG. 4. In some embodiments, the first and second dummy patterns DP1 and DP12 are connected to each other to form an enclosed ring. However, the disclosure is not limited thereto. In alternative embodiments, the first and second dummy patterns DP1 and DP12 are separate patterns extending in different directions.

The board substrates described above can be applied to form 3DIC structures. In some embodiments, the disclosure further provides a 3DIC structure 1/2 including a board structure 10, a first semiconductor package P1, a first underfill layer UF1, a second semiconductor package P2, a second semiconductor package UF2 and at least one first dummy pattern DP1. The first semiconductor package P1 is disposed over and electrically connected to the board substrate 10 through a first group of bumps B11. The first underfill layer UF1 surrounds the first group of bumps B11. The second semiconductor package P2 is disposed over and electrically connected to the board substrate 10 through a second group of bumps B12. The second underfill layer UF2 surrounds the second group of bumps B12. The at least one first dummy pattern DP1 is disposed over the board substrate 10 and between the first semiconductor package P1 and the second semiconductor package P2, and the first underfill layer UF1 and the second underfill layer UF2 are separated by the at least one first dummy pattern DP1.

The number, material, shape and distribution of the at least one first dummy pattern DP1 have been described above, so the details are not iterated herein.

In some embodiments, the dimension of the at least one first dummy pattern DP1 is greater than the dimension of the first semiconductor package P1 or the second semiconductor package P2. In some embodiments, the dimension of the at least one first dummy pattern DP1 is greater than the dimension of the first group of bumps B11 or the second group of bumps B12. For example, the dimension includes a height, a length, a width, a size or a combination thereof.

In some embodiments, the first semiconductor package P1 includes a first interposer I1 disposed over and electrically connected to the board substrate 10, and a plurality of first semiconductor chips TD11, TD12 and TD13 disposed over and electrically connected to the first interposer I1. For example, two semiconductor chips TD11 at one side of one semiconductor chip TD12, and two semiconductor chips TD13 at the other side of the same semiconductor chip TD12, as shown in FIG. 3 to FIG. 5. However, the disclosure is not limited thereto. The number and the configuration of the first semiconductor chips TD11, TD12 and TD13 can be adjusted as needed.

In some embodiments, the second semiconductor package P2 includes a second interposer I2 disposed over and electrically connected to the board substrate 10, and a plurality of second semiconductor chips TD21, TD22 and TD23 disposed over and electrically connected to the second interposer I2. For example, two semiconductor chips TD21 at one side of one semiconductor chip TD22, and two semiconductor chips TD23 at the other side of the same semiconductor chip TD22, as shown in FIG. 3 to FIG. 5. However, the disclosure is not limited thereto. The number and the configuration of the second semiconductor chips TD21, TD22 and TD23 can be adjusted as needed.

In some embodiments, the dimension of the first semiconductor package P1 is substantially the same as the dimension of the second semiconductor package P2. For example, the dimension includes a height, a length, a width, a size or a combination thereof. However, the disclosure is not limited thereto. In alternative embodiments, the dimension of the first semiconductor package P1 may be different from the dimension of the second semiconductor package P2. For example, the dimension includes a height, a length, a width, a size or a combination thereof.

In some embodiments, the first interposer I1 and the second interposer I2 can be omitted from the first semiconductor package P1 and the second semiconductor package P2, so as to further reduce the package size.

In some embodiments, the 3DIC structure 1/2 further includes at least one second dummy pattern DP2 disposed over the board substrate 10 and located outside of the first semiconductor package P1 or the second semiconductor package P2. In some embodiments, the at least one second dummy pattern DP2 is disposed between the at least one periphery device and the first semiconductor package P1 or the second semiconductor package P2.

The number, material, shape and distribution of the at least one second dummy pattern DP2 have been described above, so the details are not iterated herein.

In some embodiments, the 3DIC structure 1/2 further includes at least one periphery device PD1 or PD2. In some embodiments, the at least one periphery device PD1 or PD2 may include integrated active devices, integrated passive device or both. For example, the at least one periphery device PD1 or PD2 may include a wide variety of devices, such as processors, resistors, capacitors, transistors, diodes, fuse devices, logic devices, memory devices, discrete electronic devices, power devices, thermal dissipation devices, and/or the like. In some embodiments, the at least one periphery device PD1 or PD2 may be a dummy chip. Herein, a dummy die indicates a non-operating die, a die configured for non-use, a die without devices therein or a die used only to electrically couple together two other dies in the die stack. In some embodiments, the at least one periphery device PD1 or PD2 includes a capacitor.

In some embodiments, the at least one periphery device PD1 or PD2 is disposed over the board substrate 10 at an outer side of the first semiconductor package P1 or the second semiconductor package P2, as shown in FIG. 3 to FIG. 5. For example, a periphery device PD1 and a periphery device PD2 are disposed over the board substrate 10 at outer sides of the first semiconductor package P1 and the second semiconductor package P2, respectively, as shown in FIG. 3 and FIG. 5. For instance, three periphery devices PD1 are disposed over the board substrate 10 at three sides of the first semiconductor package P1, and three periphery devices PD2 are disposed over the board substrate 10 at three sides of the second semiconductor package P2, as shown in FIG. 4. However, the disclosure is not limited thereto. The number and the configuration of the periphery devices PD1 or PD2 can be adjusted as needed.

In some embodiments, the first underfill layer UF1 is in physical with the at least one second dummy pattern DP2 between the first semiconductor package P1 and the periphery device PD1, and the second underfill layer UF2 is in physical with the at least one second dummy pattern DP2 between the second semiconductor package P2 and the periphery device PD2.

In summary, the disclosure provides a method for underfill fillet control in packaging, especially in multi-chip module (MCM) wherein multiple dies are placed side-by-side. In some embodiments, the first and second dummy patterns DP1 and DP2 of the disclosure play a role of preventing the underfill material from bleeding to undesired bumps, devices or packages during the underfill dispensing step. Specifically, the conventional 3DIC structure without the dummy patterns of the disclosure usually has a large underfill bleeding length. However, by disposing the dummy patterns of the disclosure, the bleeding length can be significantly reduced by at least 20%. Therefore, the keep out zone (KOZ) between the first and second semiconductor packages P1 and P2 can be accordingly reduced. The accurate control of underfill fillet is beneficial to ensure reliability and adequate process window.

Dummy patterns are contemplated as falling within the spirit and scope of the present disclosure as long as the dummy patterns prevent an underfill material from bleeding to undesired bumps and/or devices between two adjacent semiconductor packages during the underfill dispensing step.

In accordance with some embodiments of the present disclosure, a board substrate includes a core layer, a first build-up layer, a second build-up layer, a first group of bumps, a second first group of bumps and at least one first underfill blocking wall. The first build-up layer and the second build-up layer are disposed on opposite sides of the core layer. The first group of bumps is disposed over the first build-up layer. The second first group of bumps is disposed over the first build-up layer. The at least one first underfill blocking wall is disposed over the first build-up layer and between the first group of bumps and the second group of bumps.

In accordance with alternative embodiments of the present disclosure, a three-dimensional integrated circuit (3DIC) structure includes a board substrate, a first semiconductor package, a first underfill layer, a second semiconductor package, a second semiconductor package and at least one first dummy pattern. The first semiconductor package is disposed over and electrically connected to the board substrate through a first group of bumps. The first underfill layer surrounds the first group of bumps. The second semiconductor package is disposed over and electrically connected to the board substrate through a second group of bumps. The second underfill layer surrounds the second group of bumps. The at least one first dummy pattern is disposed over the board substrate and between the first semiconductor package and the second semiconductor package, and the first underfill layer and the second underfill layer are separated by the at least one first dummy pattern.

In accordance with yet alternative embodiments of the present disclosure, a method of forming a three-dimensional integrated circuit (3DIC) structure includes the following steps. A board substrate is provided. At least one first dummy pattern is formed over the board substrate. A first semiconductor package and a second semiconductor structure are bonded to the board substrate at two sides of the at least one first dummy pattern. A first underfill layer is formed between the first semiconductor package and the board substrate. A second underfill layer is formed between the second semiconductor package and the board substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor package device, comprising:
a board substrate comprising:
 a core layer;
 a first build-up layer and a second build-up layer disposed on opposite sides of the core layer;
 a first solder mask layer disposed on the first build-up layer;
 a first group of bumps disposed over the first build-up layer and partially embedded by the first solder mask layer; and
 a second group of bumps disposed over the first build-up layer and partially embedded by the first solder mask layer;
a first semiconductor package disposed over and electrically connected to the board substrate through the first group of bumps;
a first underfill layer surrounding the first group of bumps;
a second semiconductor package disposed over and electrically connected to the board substrate through the second group of bumps;
a second underfill layer surrounding the second group of bumps; and
first and second insulating blocking walls spaced apart from each other, disposed over the board substrate, in direct contact with the first solder mask layer, located between and offset with the first semiconductor package and the second semiconductor package, wherein from a top view, the first and second insulating blocking walls are arranged parallel to each other and extended continuously along a gap existed between the first and second semiconductor packages,
wherein from the top view, a central part of a first sidewall of the first insulating blocking wall is in direct contact with the first underfill layer while an edge part of the first sidewall of the first insulating blocking wall is exposed from the first underfill layer, and a central part of a first sidewall of the second insulating blocking wall is in direct contact with the second underfill layer while an edge part of the first sidewall of the second insulating blocking wall is exposed from the second underfill layer,
wherein from the top view, lengths of the first and second insulating blocking walls are greater than lengths of the first and second semiconductor packages,
wherein the first semiconductor package comprises first dies and a first encapsulation layer surrounding sidewalls of the first dies while exposing top surfaces of the first dies, and the first insulating blocking wall is spaced apart from the first encapsulation layer, and
wherein the first underfill layer directly contacts and completely covers sidewalls of the first encapsulation layer, and is spaced apart from the first dies.

2. The semiconductor package device of claim 1, wherein the first encapsulation layer is spaced apart from the first group of bumps.

3. The semiconductor package device of claim 1, wherein the first and second underfill layers creep onto part of top planar surfaces of the first and second insulating blocking walls.

4. The semiconductor package device of claim 1, wherein the first solder mask layer comprises silica, barium sulfate and epoxy resin.

5. The semiconductor package device of claim 1, wherein a second sidewall of the first insulating blocking wall and a second sidewall of the second insulating blocking wall are exposed to air.

6. The semiconductor package device of claim 1, wherein edges of the first build-up layer and the second build-up layer are aligned with each other.

7. The semiconductor package device of claim 1, wherein the first and second insulating blocking walls are overlapped with dielectric layers of the board substrate in a plan view.

8. A semiconductor package device, comprising:
a board substrate comprising conductive patterns therein;
a first semiconductor package disposed over and electrically connected to the board substrate through a first group of bumps, wherein the first semiconductor package comprises at least one first die, a first interposer between the at least one first die and the board substrate, and a first encapsulation layer disposed above the first interposer and surrounding the at least one first die;
a first underfill layer surrounding the first group of bumps;

a second semiconductor package disposed over and electrically connected to the board substrate through a second group of bumps;
a second underfill layer surrounding the second group of bumps; and
first and second dummy patterns spaced apart from each other, disposed over the board substrate, in direct contact with a first solder mask layer on the board substrate, and between the first semiconductor package and the second semiconductor package, wherein from a top view, the first and second dummy patterns are arranged parallel to each other and extended continuously along a gap existed between the first and second semiconductor packages,
wherein from the top view, a central part of a sidewall of the first dummy pattern is in direct contact with the first underfill layer while an edge part of the sidewall of the first dummy pattern is exposed from the first underfill layer, and a central part of a sidewall of the second dummy pattern is in direct contact with the second underfill layer while an edge part of the sidewall of the second dummy pattern is exposed from the second underfill layer,
wherein from the top view, lengths of the first and second dummy patterns are greater than lengths of the first and second semiconductor packages,
wherein the first underfill layer directly contacts and completely covers sidewalls of the first encapsulation layer and the first interposer of the first semiconductor package, and is spaced apart from the at least one first die,
wherein a sidewall of the first encapsulation layer is flushed with a sidewall of the first interposer, and the first dummy pattern is spaced apart from the first encapsulation layer, and
wherein the first interposer comprises a first semiconductor substrate and first through substrate vias penetrating through the first semiconductor substrate, sidewalls of the first through substrate vias are substantially straight, first ends of the first through substrate vias are in direct contact with the first group of bumps, and second ends of the first through substrate vias opposite to the first ends are in direct contact with connectors of the at least one first die.

9. The semiconductor package device of claim 8, wherein the second semiconductor package comprises at least one second die, a second interposer between the at least one second die and the board substrate, and a second encapsulation layer disposed above the second interposer and surrounding the at least one second die, and
wherein the second underfill layer is in direct contact with the second encapsulation layer and the second interposer of the second semiconductor package.

10. The semiconductor package device of claim 8, wherein a top surface of the first dummy pattern is lower than a top surface of the first interposer.

11. The semiconductor package device of claim 8, wherein a top surface of the first semiconductor package is flushed with a top surface of the first encapsulation layer.

12. The semiconductor package device of claim 8, wherein the first dummy pattern is spaced apart from the first group of bumps.

13. The semiconductor package device of claim 8, further comprising at least one periphery device disposed over the board substrate at an outer side of the first semiconductor package or the second semiconductor package.

14. The semiconductor package device of claim 13, wherein the at least one periphery device comprises a capacitor and is spaced apart from the first dummy pattern or the second dummy pattern.

15. A semiconductor package device, comprising:
a board substrate comprising conductive patterns therein;
a first semiconductor package disposed over and electrically connected to the board substrate through a first group of bumps, wherein the first semiconductor package comprises at least one first die, a first interposer between the at least one first die and the board substrate, and a first encapsulation layer disposed above the first interposer and surrounding the at least one first die;
a first underfill layer surrounding the first group of bumps;
a second semiconductor package disposed over and electrically connected to the board substrate through a second group of bumps;
a second underfill layer surrounding the second group of bumps; and
at least one first insulating dummy pattern disposed over the board substrate, in direct contact with a first solder mask layer on the board substrate, and between the first semiconductor package and the second semiconductor package,
wherein the first underfill layer directly contacts and completely covers sidewalls of the first encapsulation layer and the first interposer of the first semiconductor package, is spaced apart from the at least one first die, and is in direct contact with a first sidewall of the at least one first insulating dummy pattern,
wherein a sidewall of the first encapsulation layer is flushed with a sidewall of the first interposer, and the at least one first insulating dummy pattern is spaced apart from the first encapsulation layer,
wherein at least one integrated passive device disposed over and electrically connected to the conductive patterns of the board substrate at an outer side of the first semiconductor package or the second semiconductor package, and
wherein at least one second insulating dummy pattern disposed over the board substrate and located outside of the first semiconductor package or the second semiconductor package, wherein the at least one second insulating dummy pattern is disposed between the at least one integrated passive device and the first semiconductor package or the second semiconductor package, wherein the at least one integrated passive device is spaced apart from the at least one second insulating dummy pattern, wherein the at least one second insulating dummy pattern is in direct contact with the first solder mask layer on the board substrate and electrically isolated from the conductive patterns of the board substrate.

16. The semiconductor package device of claim 15, wherein the at least one integrated passive device comprises a capacitor.

17. The semiconductor package device of claim 15, wherein the first underfill layer has a curved and smooth surface extending from a top corner of the first semiconductor package towards a top corner of the at least one second insulating dummy pattern.

18. The semiconductor package device of claim 15, wherein the first solder mask layer comprises silica, barium sulfate and epoxy resin.

19. The semiconductor package device of claim 15, wherein the at least one first insulating dummy pattern comprises first and second insulating dummy strips, wherein from a top view, the first and second insulating dummy strips are arranged parallel to each other and extended continuously along a gap existed between the first and second semiconductor packages, and wherein from the top view, a central part of a sidewall of the first insulating dummy strip is in direct contact with the first underfill layer while an edge part of the sidewall of the first insulating dummy strip is exposed from the first underfill layer, and a central part of a sidewall of the second insulating dummy strip is in direct contact with the second underfill layer while an edge part of the sidewall of the second insulating dummy strip is exposed from the second underfill layer.

20. The semiconductor package device of claim 19, wherein from the top view, lengths of the first and second insulating dummy strips are greater than lengths of the first and second semiconductor packages.

\* \* \* \* \*